US012805059B2

(12) United States Patent
Bailat et al.

(10) Patent No.: US 12,805,059 B2
(45) Date of Patent: Nov. 17, 2026

(54) TRANSPARENT SOLAR CELL FOR AN ELECTRONIC DEVICE AND METHOD FOR MANUFACTURING SAID SOLAR CELL

(71) Applicant: NIVAROX-FAR S.A., Le Locle (CH)

(72) Inventors: Julien Bailat, Bienne (CH); Gabriel Christmann, Neuchâtel (CH); Didier Domine, Prêles (CH)

(73) Assignee: NIVAROX-FAR S.A., Le Locle (CH)

(*) Notice: Subject to any disclaimer, the term of this patent is extended or adjusted under 35 U.S.C. 154(b) by 0 days.

(21) Appl. No.: 18/922,905

(22) Filed: Oct. 22, 2024

(65) Prior Publication Data

US 2025/0176306 A1 May 29, 2025

(30) Foreign Application Priority Data

Nov. 23, 2023 (EP) .................................... 23211818

(51) Int. Cl.

| | |
|---|---|
| ***H10F 77/30*** | (2025.01) |
| ***G04C 10/02*** | (2006.01) |
| ***H10F 71/00*** | (2025.01) |
| ***H10F 71/10*** | (2025.01) |
| ***H10F 77/20*** | (2025.01) |
| ***H10F 77/70*** | (2025.01) |

(52) U.S. Cl.
CPC ........... *H10F 77/315* (2025.01); *G04C 10/02* (2013.01); *H10F 71/103* (2025.01); *H10F 71/138* (2025.01); *H10F 77/244* (2025.01); *H10F 77/707* (2025.01)

(58) Field of Classification Search
None
See application file for complete search history.

(56) References Cited

U.S. PATENT DOCUMENTS 4,686,321 A 8/1987 Kishi
4,689,438 A * 8/1987 Fukatsu ................. H10F 10/17 136/258

(Continued)

FOREIGN PATENT DOCUMENTS

FR 2 681 189 A1 3/1993
JP 39-29394 Y 10/1964

(Continued)

OTHER PUBLICATIONS

European Search Report for 23 21 1818, dated Apr. 30, 2024.
Communication dated Feb. 24, 2026, issued in Japanese Application No. 2024-194578.

*Primary Examiner* — Eli S Mekhlin
(74) *Attorney, Agent, or Firm* — Sughrue Mion, PLLC

(57) ABSTRACT

A solar cell (10) for an electronic device, includes a substrate (100) made of a transparent material to be exposed to incident light radiation, a first electrode (110) made of a transparent, electrically conducting material, formed on one face of the substrate (100) an absorbent layer (130) extending, via an outer face (131), onto an inner face (111) of the first electrode (110), and a second electrode (120) made of an electrically conducting material and extending onto an inner face (132) of the absorbent layer (130) opposite an outer face (131) thereof, the absorbent layer (130) and the second electrode (120) being perforated so as to delimit a plurality of blind cavities (140), the bottom of each of which is formed by the inner face (111) of the first electrode (110.

9 Claims, 1 Drawing Sheet

(56) References Cited

U.S. PATENT DOCUMENTS

| | | | | |
|---|---|---|---|---|
| 4,795,500 | A * | 1/1989 | Kishi | H10F 19/37 136/258 |
| 2010/0096008 | A1 | 4/2010 | Lee | |
| 2011/0100424 | A1* | 5/2011 | Roche | G02B 1/115 136/246 |
| 2018/0254365 | A1 | 9/2018 | Kim | |
| 2021/0013354 | A1* | 1/2021 | Liu | H10F 77/484 |
| 2022/0291638 | A1* | 9/2022 | Imboden | G04C 10/02 |

FOREIGN PATENT DOCUMENTS

| | | | |
|---|---|---|---|
| JP | 50-133982 | U | 11/1975 |
| JP | 52-25569 | U | 2/1977 |
| JP | 62-110183 | A | 5/1987 |
| JP | 63-2386 | A | 1/1988 |
| JP | 2001-267604 | A | 9/2001 |
| JP | 2009-224757 | A | 10/2009 |
| JP | 2010-141192 | A | 6/2010 |
| JP | 2016-68478 | A | 5/2016 |
| JP | 2022-56319 | A | 4/2022 |
| WO | 2006/046397 | A1 | 5/2006 |
| WO | 2010/087320 | A1 | 8/2010 |
| WO | 2011/083282 | A1 | 7/2011 |
| WO | 2023/030703 | A1 | 3/2023 |

* cited by examiner

TRANSPARENT SOLAR CELL FOR AN ELECTRONIC DEVICE AND METHOD FOR MANUFACTURING SAID SOLAR CELL

CROSS REFERENCE TO RELATED APPLICATIONS

This application claims priority to European Patent Application No. 23211818.2 filed Nov. 23, 2023, the entire contents of which are incorporated herein by reference.

TECHNICAL FIELD OF THE INVENTION

The invention relates to the field of transparent solar cells for electrically powering electronic devices.

More particularly, the invention relates to a solar cell intended in particular, in a preferred application, for the field of watchmaking, i.e. for electrically powering the drive means of a horological movement capable of controlling the display means of a timepiece.

More generally, the solar cell according to the invention is suitable for being integrated into various transparent objects, such as windows, portholes or windscreens, or into the screens of portable electronic devices, such as electronic tablets, mobile phones and electronic watches.

TECHNOLOGICAL BACKGROUND

In certain fields, in particular in the construction, portable electronic device or watchmaking device field, the need has arisen for solar cells that can be hidden from a user's view, in order to provide an electrical power source while allowing a user to see therethrough.

This type of solar cell consists, as described in the patent document FR2681189, of an absorbent layer adapted to absorb light and convert it into electrical energy, typically made of a semiconductor material such as silicon, and arranged between a first electrode made of a transparent material and a second electrode made of an opaque metallic material. The first electrode extends over a transparent substrate forming the support for the solar cell.

The transparent layer and the second electrode are perforated up to the transparent substrate in order to obtain the light transmission required to generate the transparency of the solar cell.

In particular, the perforations in the solar cell are dimensioned and distributed in such a way as to allow some of the incident light to pass through the absorbent layer and the second electrode without being absorbed thereby in order to generate transparency in the solar cell for a user looking at it with the naked eye.

It goes without saying that the larger the surface area of the solar cell covered by perforations, the greater the transparency of the solar cell and the lower its electrical efficiency. Conversely, the smaller the surface area, the lower the transparency of the solar cell and the higher its electrical efficiency. This is because semi-transparent solar cells allow part of the light to pass through while converting the other part into electricity using the photovoltaic effect.

The requirement regarding the aesthetic appearance of the solar cell, in particular its transparency, is thus to the detriment of its electrical efficiency, and so a compromise must be found between the level of transparency of the solar cell and its electrical performance.

In order to increase the electrical efficiency of the solar cell, the first electrode can have a roughness on one of its faces that allows it to scatter the light and thus optimise its absorption by the absorbent layer by trapping the incident light radiation. Such a solution is described in the patent document WO2011/083282.

However, the roughness of the first electrode generates a certain haze factor. The haze factor is the ratio of the intensity of scattered light to the intensity of total light transmitted. A haze factor of at least 10% is typically sought in order to optimise the electrical performance of a solar cell.

This solution is not suitable for a transparent solar cell. This is because such a haze factor is not acceptable for applications specific to a transparent solar cell, in particular watchmaking applications, insofar as this haze factor will generate a blurring of the solar cell, hindering the reading of the time and the perception of the details on the dial.

There is thus a need to increase the electrical efficiency of solar cells without compromising on their transparency.

SUMMARY OF THE INVENTION

The invention overcomes the aforementioned drawbacks by providing a solar cell intended to have a high level of transparency, while providing high electrical performance, i.e. high efficiency.

To this end, the present invention relates to a solar cell for an electronic device, which solar cell comprises a substrate made of a transparent material intended to be exposed to incident light radiation, and a first electrode made of a transparent, electrically conducting material, formed on one face of the substrate and comprising an inner face opposite an outer face facing the substrate. Over its entire surface, the inner face has a roughness such that it is suitable for scattering incident light radiation, for example a roughness represented by its root mean square Rq of between 5 and 70 nm, or even of between 20 and 70 nm. The solar cell further comprises an absorbent layer extending, via an outer face, onto the inner face of the first electrode, and a second electrode made of an electrically conducting material and extending onto an inner face of the absorbent layer opposite the outer face thereof, the absorbent layer and the second electrode being perforated so as to delimit a plurality of blind cavities, the bottom of each of which is formed by the inner face of the first electrode. The solar cell further comprises a transparent protective layer covering the second electrode and filling each cavity, and which has a refractive index of between 1.3 and 1.8.

These features maximise both the transparency of the solar cell and its electrical performance.

As the refractive index of the first electrode and that of the protective layer are very close, their interface has a low refractive power, which makes it possible to reduce the haze factor and thus maximise the transparency of the cell.

Moreover, maintaining the surface condition of the first electrode advantageously allows the cell manufacturing process to be optimised. In particular, this feature does away with the need for a step of patterning the first electrode. Furthermore, the fact that no through-openings are created in the first electrode means that optimum electrical performance can be maintained, in particular facilitating current collection by minimising series resistance losses.

Finally, thanks to the invention, the scattering power is retained where it is useful for the solar cell, i.e. facing the absorbent layer.

Typically speaking, the present invention has an advantageous application in all fields in which observation through the solar cell is an important criterion, such as in the field of glazing for buildings or transport, or in the field of electronic devices, such as televisions, electronic tablets or mobile phones.

In particular embodiments, the invention can further include one or more of the following features, which must be considered singly or according to any combination technically possible.

In particular embodiments, the protective layer has a refractive index of between 1.4 and 1.6, for example a refractive index of 1.5.

In particular embodiments, the protective layer is formed by a stack of two layers comprising a first layer deposited against the first and second electrode, and a second layer deposited against the first layer, the first layer comprising a refractive index of between 1.5 and 1.8 and the second layer comprising a refractive index of between 1.3 and 1.5.

In particular embodiments, the first layer has a refractive index of 1.6 or 1.7.

In particular embodiments, the second layer has a refractive index of 1.4.

In particular embodiments, the protective layer is made of parylene, polyimide, siloxane, a nitride or a silicon oxide.

In particular embodiments, the substrate is formed by a stack of layers comprising a carrier layer and an interlayer, the latter being interposed between the carrier layer and the first electrode and being configured so as to have a refractive index of between 1.6 and 1.9.

Another subject matter of the present invention relates to a timepiece comprising a case including a middle, a crystal and a back defining an internal volume in which a horological movement is housed. The timepiece further includes a solar cell as described above, arranged to electrically power the horological movement.

In particular embodiments, the solar cell is fastened to the crystal so that the substrate bears thereagainst, with the second electrode facing the internal volume of the case.

In particular embodiments, the crystal is formed by the substrate, with the solar cell arranged so that the second electrode faces the internal volume.

In particular embodiments, the substrate forms the dial so that it faces the crystal.

Another subject matter of the present invention relates to a method for manufacturing a solar cell, which method comprises the steps of:

- forming, on a transparent substrate, a first electrode in the form of a transparent, electrically conducting layer provided with an inner face having a roughness that allows it to scatter incident light radiation;
- forming, on the inner face of the first electrode, an absorbent layer adapted to absorb incident light radiation and to generate an electric current therefrom;
- forming, on the absorbent layer, a second electrode in the form of an electrically conducting layer;
- patterning the second electrode and the absorbent layer so as to form a plurality of blind cavities extending as far as the inner face of the first electrode, said patterning step being carried out without modifying the surface condition of the inner face;
- depositing a transparent protective layer with a refractive index of between 1.3 and 1.8, or even of between 1.4 and 1.6, so as to cover the second electrode and the bottom of each cavity.

In particular implementations, during the patterning step, the second electrode and the absorbent layer are successively perforated by carrying out a first and a second successive etching operation.

In particular implementations, the second electrode forms an etching mask during the second patterning operation.

In particular implementations, the step of depositing a protective layer comprises an operation consisting of depositing a first layer having a refractive index of between 1.5 and 1.8, followed by an operation consisting of depositing a second layer having a refractive index of between 1.3 and 1.5.

In particular implementations, the substrate is formed, during a preliminary step, by a stack of layers comprising a carrier layer on which is deposited an interlayer intended to be interposed between said carrier layer and the first electrode.

BRIEF DESCRIPTION OF THE FIGURES

Other features and advantages of the invention will become apparent from the following detailed description, which is given by way of example and is by no means limiting, with reference to the accompanying drawings in which.

It should be noted that the figures are not necessarily drawn to scale for reasons of clarity.

DETAILED DESCRIPTION OF THE INVENTION

The description of the invention below is made in the context of an application of the invention to an electronic device formed by a timepiece, for example a watch. However, it goes without saying that the invention is not limited to this application and that it could advantageously be used in any other application.

It should also be noted that the term "transparent" is used herein to refer to a capacity of a material to allow all or part of a light ray, particularly light visible to the naked eye, to pass through.

The invention relates to a solar cell 10 adapted to transform light radiation into an electric current in order, for example, to power, via a power supply circuit, the drive means of a horological movement housed in a case in order to control the display means of a timepiece. The power supply circuit, the drive means and the display means of a timepiece are well known to a person skilled in the art and do not, as such, relate to the present invention; they will thus not be described in detail below and are not shown in the figures.

Figure 1:
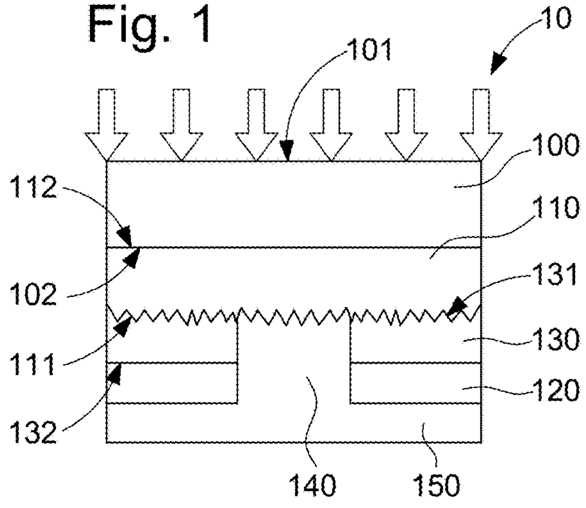
FIG. 1 diagrammatically shows a sectional view of a solar cell according to the invention.
Figure 2:
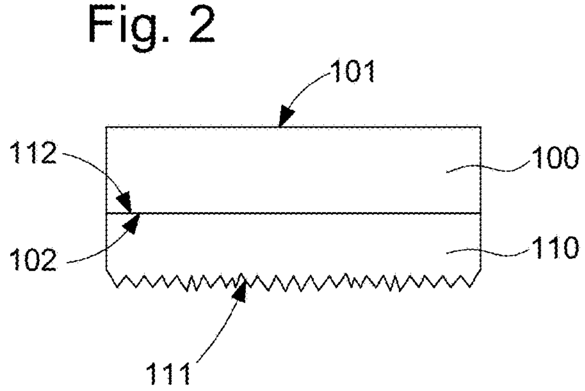
FIGS. 2 to 5 diagrammatically show a sectional view of the solar cell of FIG. 1 during different steps of a manufacturing method according to the invention.
Figure 3:
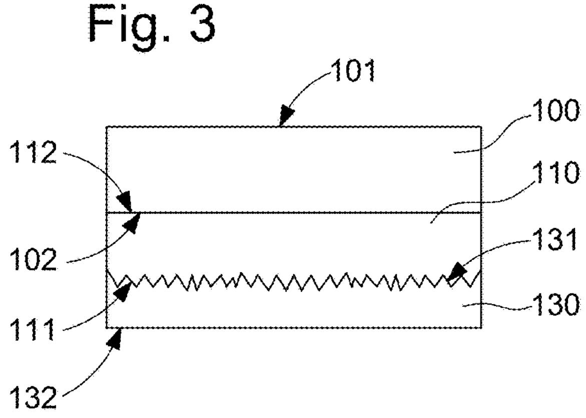
Figure 4:
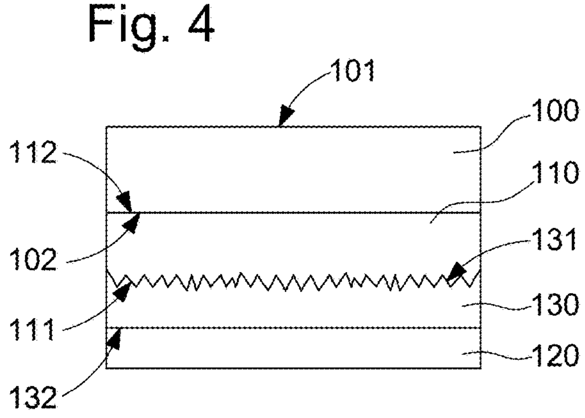

As shown in FIG. 1, the solar cell 10 comprises a substrate 100 made of a transparent material intended to be exposed to light radiation via an outer face 101. The substrate 100 is formed by a layer or by a stack of layers, as described in more detail below in a particular example embodiment of the invention. By way of non-limiting example, the substrate 100 has a thickness of between 0.1 and 2 mm, preferably of between 0.1 and 0.5 mm.

In an alternative embodiment, the light radiation is incident or transmitted radiation. In FIG. 1, the incident or transmitted radiation is symbolised by thick arrows.

By way of example, the substrate 100 can be fastened so that its outer face 101 is arranged against a watch crystal, for example by adhesive bonding or by mechanical or physical fastening means, such as ionic bonding or pulse current bonding, on its periphery. The light radiation to which the outer face 101 of the substrate 100 is subjected is thus radiation transmitted through the crystal.

Alternatively, the substrate 100 can constitute the crystal of the timepiece. The light radiation to which the outer face 101 of the substrate 100 is subjected is thus incident radiation. The substrate 100 can include, in particular in this case, an anti-reflection treatment on its outer face 101 in order to maximise the quantity of light radiation received through said substrate 100.

In another application of the invention, the substrate 100 forms the dial, such that it is arranged facing the crystal.

This substrate 100 is made, for example, of glass, sapphire or a polymer, such as polyethylene naphthalate, also known by the acronym "PEN", or polyethylene terephthalate, also known by the acronym "PET". Other polymers such as polycarbonate (PC) or polymethyl methacrylate acrylic (PMMA) are also possible.

The solar cell 10 further comprises a first electrode 110 formed on all or part of a surface of an inner face 102 of the substrate 100 opposite the outer face 101. This first electrode 110 is directly exposed to light radiation transmitted through the substrate 100, from the radiation passing through said substrate 100. By way of a non-limiting example, the first electrode 110 has a thickness of between 0.5 and 5 μm, preferably between 1 and 2 μm.

The first electrode 110 is made of a transparent, electrically conducting material, for example of a metal oxide, also known by the acronym "TCO", such as zinc oxide (ZnO), tin oxide ($SnO_2$) or indium tin oxide (ITO), and comprises an inner face 111 opposite an outer face 112 facing the substrate 100. The inner face 111 has a surface condition that allows incident light radiation to be scattered.

More specifically, the inner face 111 has, over its entire surface, a roughness due to the arrangement of the crystals of the material of the first electrode 110; the method for depositing the first electrode 110 and its parameters being chosen so as to control said arrangement. In other words, the first electrode 110 is deposited in such a way that its crystals define a predetermined surface condition of its inner face 111 allowing the incident light radiation to be scattered. In particular, the inner face 111 is configured so as to have a roughness represented by its root mean square Rq of between 5 and 70 nm, or even of between 20 and 70 nm.

The solar cell 10 comprises an absorbent layer 130 arranged between the first electrode 110 and a second electrode 120. As can be seen in FIG. 1, the absorbent layer 130 extends via an outer face 131 only over a portion of the inner face 111 of the first electrode 110 and has, for example, a thickness of between 100 nm and 1 μm, and preferably of between 300 and 500 nm.

The absorbent layer 130 is made of a semiconductor material, such as silicon, for example amorphous silicon. The absorbent layer 130 is adapted to absorb light radiation and to generate an electric current therefrom towards terminals connected to the first and second electrode 110 and 120.

Advantageously, and as shown diagrammatically in FIG. 1, the absorbent layer 130 conforms to any point on the surface of the inner face 111 of the first electrode 110, so that they have a complementary shape and thus an identical roughness.

The second electrode 120 is made of an electrically conducting material and extends over an inner face 132 of the absorbent layer 130 opposite the outer face 131 thereof.

Advantageously, the second electrode 120 can be made of TCO, which allows the absorbent layer 130 to be able to absorb some of the radiation transmitted through the substrate 100 and some of the radiation reflected by any element arranged in the vicinity of the solar cell 10, opposite said substrate 100, i.e. on the side of the second electrode 120. This feature thus maximises the quantity of radiation absorbed by the absorbent layer 130 and thus increases its electrical performance.

In another alternative embodiment of the invention, the second electrode 120 is made of a metallic material, such as silver or aluminium.

Figure 5:
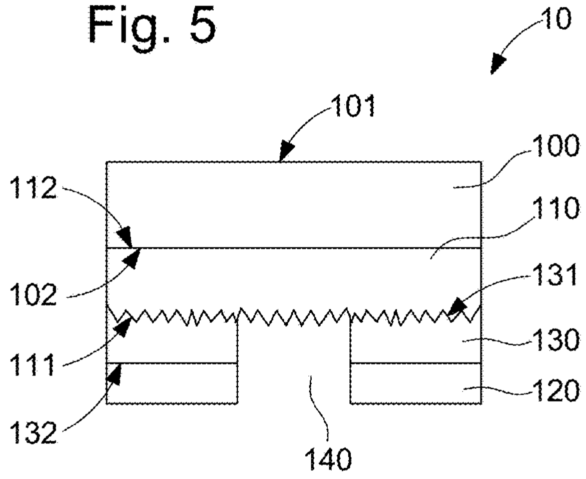

As can be seen in FIGS. 1 and 5, the absorbent layer 130 and the second electrode 120 are perforated so as to delimit a plurality of blind cavities 140, the bottom of each of which is formed by the inner face 111 of the first electrode 110. In other words, the solar cell 10 comprises cavities 140 passing through the second electrode 120 and the absorbent layer 130, and extending as far as the inner face 111 of the first electrode 110.

Thanks to these features, the transmitted light radiation can pass through the solar cell 10 and the latter can have a very good level of transparency, depending on the distribution pattern of the cavities 140 and their dimensions.

Advantageously, the cavities 140 can have a circular or hexagonal cross-section. The latter shape has the advantage of minimising electrical loss.

The cross-sections of the cavities 140 can alternatively have all kinds of regular or irregular, geometrically single or multiple shapes providing a paving opening onto the inner face 111 of the first electrode 110. By way of example, the cavities 140 can be linear, such as grooves, or polygonal in shape, such as triangular, square, or in the shape of letters, or logos, etc.

As illustrated in FIG. 1, the solar cell 10 advantageously comprises a protective layer 150 made of a transparent material, encapsulating the first and second electrode 110 and 120, as well as the absorbent layer 130; i.e. it fills each cavity 140. This protective layer 150 is thus deposited on a side of the solar cell 10 opposite the substrate 100, and protects the solar cell 10 from any external attack or pollution.

Such a protective layer 150 can be made of parylene, polyimide, siloxane, a nitride, for example silicon nitride, or an oxide, for example silicon oxide.

This layer has an advantageous optical function. In particular, the material of the protective layer 150 is chosen so that it has a refractive index between that of the ambient air, which is approximately equal to 1, and that of the first electrode 110, which is approximately equal to 2. This is to minimise the haze factor at the interface between the inner face 111 of the first electrode 110 and the protective layer 150, and to minimise the reflective power at the interface between the air and the protective layer 150. In particular, the protective layer 150 is configured so that its refractive index is between 1.3 and 1.8, or even between 1.4 and 1.6, and is preferably equal to 1.5.

This feature increases the transparency of the solar cell 10 at the cavities 140. This is because, as the refractive indices of the inner face 111 of the first electrode 110 and of the protective layer 150 are close to each other, very little light radiation is scattered by the inner face 111 of the first electrode 110. Moreover, as the refractive index of the protective layer 150 is also close to that of air, the light radiation passing through the solar cell 10 is reflected very little. In particular, the interface between the inner face 110 of the first electrode 110 and the protective layer 150 transmits a very large proportion of the light radiation, for example more than 98%.

For example, if the inner face 111 of the first electrode 110 has a roughness Rq equal to 60 nm and the protective layer 150 has a refractive index of 1.5, the haze factor of the first electrode 110 is between 4 and 5%, whereas if the inner face 111 has an interface with air, its haze factor is 35%. Furthermore, if the protective layer 150 has a refractive index of 1.7, the haze factor of the first electrode 110 is 1%.

Thanks to the present invention, the solar cell 10 thus has a high degree of transparency, allowing a user to see clearly through it. This transparency is achieved by preserving the surface condition of the inner face 111 of the first electrode 110, and thus by avoiding the need for any patterning operation at the bottom of the cavities 140. For information, such a patterning operation would have made it possible to eliminate part of the first electrode 110 or to smooth its surface condition.

Figure 6:
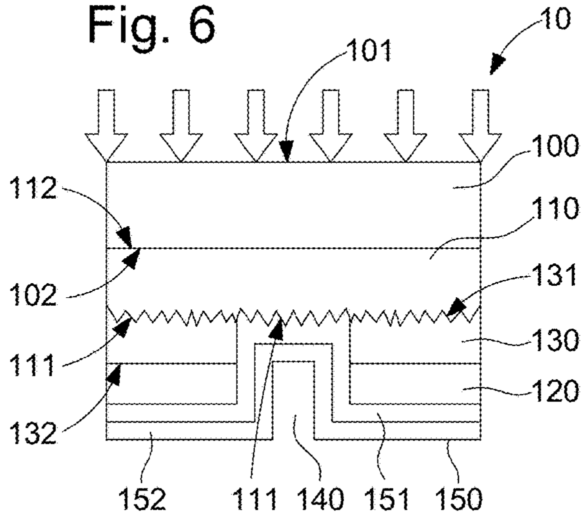
FIG. 6 diagrammatically shows a sectional view of a solar cell according to another embodiment of the invention.

In an example embodiment of the invention shown in FIG. 6, the protective layer 150 is formed by a stack of two layers comprising a first layer 151 deposited against the first and second electrode 110 and 120, and a second layer 152 deposited against the first layer 151.

The first layer 151 advantageously has a refractive index of between 1.5 and 1.8, and preferably a refractive index of 1.6 or 1.7. The second layer 152 has a refractive index of between 1.3 and 1.5, and preferably a refractive index of 1.4. Thus, the difference between the refractive indices of the first electrode 110 and of the first layer 151 is minimised, as is the difference between the refractive indices of the latter and of the second layer 152, and the difference between the refractive indices of the second layer 152 and air. Minimising the difference between two contiguous media makes it possible, as described above, to considerably improve the transparency of the solar cell 10.

In an example embodiment of the invention not shown in the figures, the substrate 100 is formed by a stack of layers comprising a carrier layer and an interlayer, the latter being interposed between the carrier layer and the first electrode 110 and being configured so as to have a refractive index that minimises optical reflections and thus enhances the transparency of the solar cell 10. In particular, the interlayer extends, for example, over a thickness of between 60 and 100 nm and has a refractive index of between 1.6 and 1.9. This interlayer can be made of any suitable transparent material.

The carrier layer can be made of any transparent material, for example a material as mentioned above for the substrate 100.

The present invention further relates to a method for manufacturing a solar cell 10, preferably in accordance with the solar cell 10 described above.

The manufacturing method comprises the following successive steps, which are shown chronologically in FIGS. 2 to 5 and FIG. 1 respectively.

This method advantageously comprises a step of forming the first electrode 110 on the substrate 100, so that said first electrode 110 comprises, over the whole of its inner face 111, a roughness such that it is able to scatter incident light radiation, for example a roughness Rq of between 5 and 70 nm, or even between 20 and 70 nm.

This step is followed by a step of forming the absorbent layer 130 on the inner face 111 of the first electrode 110, then by a step of forming the second electrode 120 on the absorbent layer 130.

A patterning step is then carried out to form a plurality of blind cavities 140 through the second electrode 120 and the absorbent layer 130 to the inner face 111 of the first electrode 110.

The areas to be perforated during the patterning step are determined by masking the areas of the second electrode 120 and of the absorbent layer 130 that are to be preserved, for example by photolithography.

During the patterning step, the second electrode 120 and the absorbent layer 130 can be successively perforated by implementing successive etching operations. In particular, a first etching operation can consist in forming a plurality of cavities 140 through the second electrode 120 and extending as far as the absorbent layer 130, and a second etching operation can be carried out so as to extend the cavities 140 through the absorbent layer 130, as far as the first electrode 110.

Given the materials constituting the second electrode 120 and the absorbent layer 130 respectively, the first etching operation can be carried out using a wet chemical etching method, and the second etching operation can be carried out using a dry etching method, such as a plasma chemical etching method or ion etching method.

Advantageously, the second electrode 120 can be used as an etching mask during the second patterning operation, thereby protecting the portion of absorbent layer 130 on which it is deposited.

The fact that the first electrode 110 is not perforated means that its electrical resistance is not increased, thus preserving the electrical performance of the solar cell 10. This also reduces the time needed to carry out the method and the energy consumed thereby.

A step of depositing a transparent protective layer 150 is then carried out following the patterning step so as to cover the second electrode 120 and the bottom of each cavity 140.

In particular, this step can be carried out by spin coating, for example if the material of the protective layer 150 is made of polyimide. This step can alternatively be carried out by a chemical vapour deposition method, if the material of the protective layer 150 is made of parylene, or by a plasma-enhanced chemical vapour deposition method, if the material chosen to form the protective layer 150 is an oxide or a nitride. It is also possible to deposit the protective layer 150 using a physical vapour deposition method, by evaporation or by cathodic sputtering, for example in the case where the protective layer 150 is made of a nitride.

Alternatively, the protective layer 150 can be formed by a transparent, self-adhesive film bonded, during the deposition step, to the first and second electrode 110 and 120.

The substrate 100 can be formed, in a preliminary step, by a stack of layers comprising a carrier layer on which an interlayer is deposited, the first electrode 110 being deposited on the latter.

A first electrode 110 can be formed by implementing a chemical vapour deposition method, the absorbent layer 130 can be formed by implementing a plasma-enhanced chemical vapour deposition method and the second electrode 120 can be formed by implementing a physical vapour deposition method.

It goes without saying that these deposition methods are given by way of indication, as the first and second electrode 110 and 120 and the absorbent layer 130 can be deposited by any deposition method suitable for their respective material.

More generally, it should be noted that the implementations and embodiments considered above have been described by way of non-limiting examples, and that other alternatives are thus possible.

In particular, the first and second electrode 110 and 120, as well as the absorbent layer 130 and the protective layer 150 can be formed by a single layer or by a stack of layers.

The invention claimed is:

1. A solar cell for an electronic device, comprising:

a substrate made of a transparent material intended to be exposed to incident light radiation, a first electrode made of a transparent, electrically conducting material, formed on one face of the substrate and comprising an inner face opposite an outer face facing the substrate, said inner face having, over its entire surface, a roughness such that it is suitable for scattering incident light radiation, an absorbent layer extending, via an outer face, onto the inner face of the first electrode, a second electrode made of an electrically conducting material and extending onto an inner face of the absorbent layer opposite the outer face thereof, the absorbent layer and the second electrode being perforated so as to delimit a plurality of blind cavities, the bottom of each of which is formed by the inner face of the first electrode, and a transparent protective layer covering the second electrode and filling each cavity, and which has a refractive index of between 1.3 and 1.8, wherein the transparent protective layer is formed by a stack of two layers comprising a first layer deposited against the first and second electrode, and a second layer deposited against the first layer, the first layer comprising a refractive index of between 1.5 and 1.8 and the second layer comprising a refractive index of between 1.3 and 1.5.

2. The solar cell (10) according to claim 1, wherein the second layer (152) has a refractive index of 1.4.

3. The solar cell (10) according to claim 1, wherein the transparent protective layer (150) comprises parylene, polyimide, siloxane, a nitride or an oxide.

4. The solar cell (10) according to claim 1, wherein the substrate (100) is formed by a stack of layers comprising a carrier layer and an interlayer, the latter being interposed between the carrier layer and the first electrode (110) and being configured so as to have a refractive index of between 1.6 and 1.9.

5. A timepiece comprising a case including a middle, a crystal and a back defining an internal volume in which a horological movement is housed, said timepiece being characterised in that it further includes the solar cell (10) according to claim 1, arranged to electrically power the horological movement.

6. The timepiece according to claim 5, wherein the solar cell (10) is fastened to the crystal so that the substrate (100) is arranged to bear thereagainst, with the protective layer (150) facing the internal volume of the case.

7. The timepiece according to claim 5, wherein the crystal is formed by the substrate (100), with the solar cell (10) arranged so that the transparent protective layer (150) faces the internal volume.

8. The timepiece according to claim 5, wherein the substrate (100) constitutes the dial such that it faces the crystal.

9. The solar cell (10) according to claim 1, wherein the first layer (151) has a refractive index of 1.6 or 1.7.

* * * * *